Figure 1:
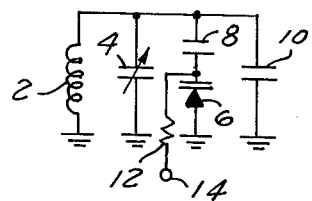

United States Patent [19]
Sato

[11] 3,947,772
[45] Mar. 30, 1976

[54] AFC TUNING CIRCUIT
[75] Inventor: Shoji Sato, Soma, Japan
[73] Assignee: Alps Electric Co., Ltd., Tokyo, Japan
[22] Filed: Feb. 6, 1975
[21] Appl. No.: 547,385

[30] Foreign Application Priority Data
Feb. 15, 1974 Japan................................ 49-18296

[52] U.S. Cl............................. 325/422; 331/36 C
[51] Int. Cl.².......................................... H04B 1/16
[58] Field of Search................... 325/346, 418–423, 325/453, 457, 468; 331/36 R, 36 C, 177 V; 334/14–16, 78; 332/30 V; 178/5.8 AF

[56] References Cited
UNITED STATES PATENTS

| | | | |
|---|---|---|---|
| 2,811,647 | 10/1957 | Nilssen | 331/36 C |
| 3,332,035 | 7/1967 | Kovalevski | 331/36 C |
| 3,400,338 | 9/1968 | Ishman | 331/36 C |
| 3,517,352 | 6/1970 | Marshall et al. | 325/468 |
| 3,519,939 | 7/1970 | Tashima | 325/422 |
| 3,533,000 | 10/1970 | Bushnell | 331/36 C |
| 3,825,858 | 7/1974 | Amemiya et al. | 325/422 |

Primary Examiner—Benedict V. Safourek
Assistant Examiner—Jin F. Ng

[57] ABSTRACT

An AFC tuning circuit is provided having a tuning capacitance in parallel with a series connection of a varactor and an inductance coil. A series-connected switch and capacitor are connected in parallel with the varactor. Another switch is connected in parallel with a portion of the inductance coil. Both switches are open for a lower frequency band and closed for a higher frequency band to provide a relatively uniform AFC circuit sensitivity for both frequency bands.

3 Claims, 8 Drawing Figures

AFC TUNING CIRCUIT

The present invention relates to an AFC tuning circuit and, more particularly, to an improvement for providing a relatively uniform corrective frequency shift in response to a given voltage signal from an AFC frequency-drift detecting circuit for a relatively wide range of tuning frequencies.

In a conventional tuner, a radio frequency (RF) signal detected by an antenna is amplified and then mixed with a lower frequency signal generated by a local oscillator to produce an intermediate frequency (IF) signal. Conventional circuitry processes the IF signal to produce signals suitable for either a video or an audio transducer. Since numerous signals, each utilizing a certain frequency, are transmitted within a particular frequency range, a means is required to accurately distinguish a particular frequency from all the others. To this end, the tuner includes a tuning circuit which has a relatively narrow frequency range so that only one signal at a specific frequency will be detected with all others being blocked, or filtered, out. Because of the frequency response characteristic of the tuning circuit, the IF frequency must be maintained accurately. Otherwise, should the IF frequency drift, the tuning circuit will filter it out. Consequently, any frequency drift in the transmitted frequency and/or the local oscillator frequency must be compensated for by the tuning circuit or corrected at the source of the drift. For the latter method, should the local oscillator drift, for example, its frequency is shifted back to its correct value. For the former method, the tuned frequency of the tuning circuit is adjusted slightly to follow the frequency drift. An automatic frequency control (AFC) circuit is conventionally used to provide this frequency adjustment.

The conventional AFC circuit is comprised of a frequency-drift detector which generates a voltage signal whose magnitude is dependent on the sense and magnitude of the frequency drift about the correct frequency. This voltage signal is applied to a voltage responsive element in the tuning circuit which changes the tuned frequency of the tuning circuit just enough to follow the frequency drift. The AFC sensitivity of the tuning circuit is based on the amount of frequency shift generated in response to a given voltage from the frequency-drift detector.

Conventional AFC circuits are basically of two types, with each being unsatisfactory for a particular reason. Ideally, the ratio between sensitivities for various tuning frequencies is unity. However, with the first type of circuit, the sensitivity at one end of a frequency band varies significantly from the sensitivity for a frequency at the other end of the frequency band. This can create serious problems. To use, as an example, U.S. VHF television channels 2-13, the sensitivity is higher for channel 2 than for channel 13. Thus, if the tuning circuit is designed to provide a satisfactory corrective shift for channel 13, then the shift for channel 2 will be so wide as to possibly detect signals from a neighboring channel as well. On the other hand, should the corrective shift be designed to accommodate channel 2, the shift for channel 13 would be so small as to render ineffective the drift compensating function of the AFC circuit. The second type of circuit provides an improved uniformity for the sensitivity in a given frequency band but it is particularly sensitive to stray inductance and capacitance which can cause oscillation and undesirable discontinuities in its sensitivity characteristic curve. Furthermore, it requires certain component values which must be precisely adjusted at the factory, a time-consuming operation, in order to obtain the improved uniformity.

It is, therefore, the prime object of the present invention to provide an AFC tuning circuit having a relatively uniform sensitivity for a given frequency range.

It is another object of the present invention to provide a simple and relatively inexpensive AFC tuning circuit with improved performance.

It is a further object of the present invention to provide an AFC tuning circuit that needs little factory adjustment of the components and is relatively insensitive to stray inductance and capacitance.

In accordance with the above objects, the AFC tuning circuit of the present invention has a varactor connected in a series circuit with a tuning inductance. The tuning capacitor is connected in parallel with this series circuit. Another capacitor is selectably connectable in parallel with the varactor by means of a switch and another switch is connected in parallel with a portion of the inductance coil. Both switches are open for a lower frequency band and are closed for a higher frequency band.

Figure 2:
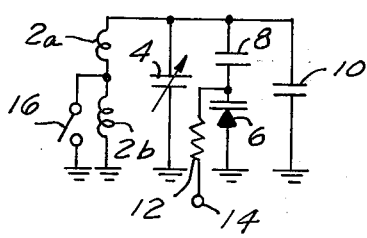
Figure 3:
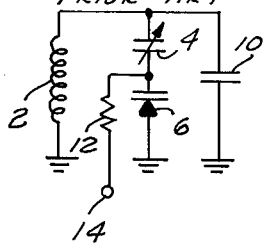
Figure 4:
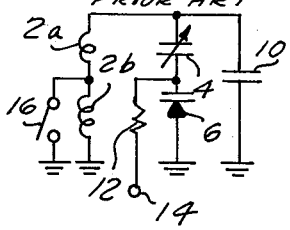
Figure 5:
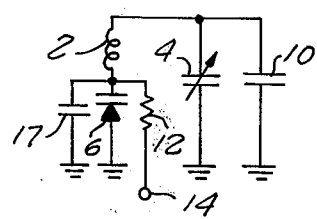
Figure 6:
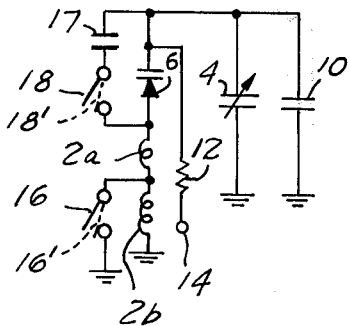
Figure 7:
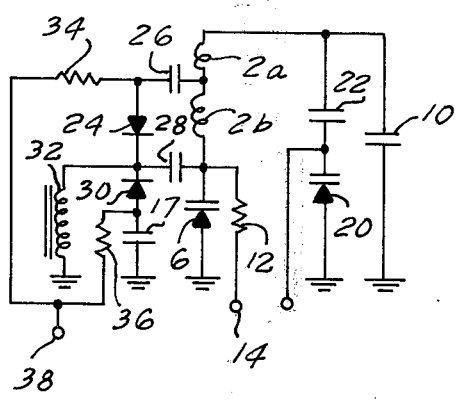
Figure 8:
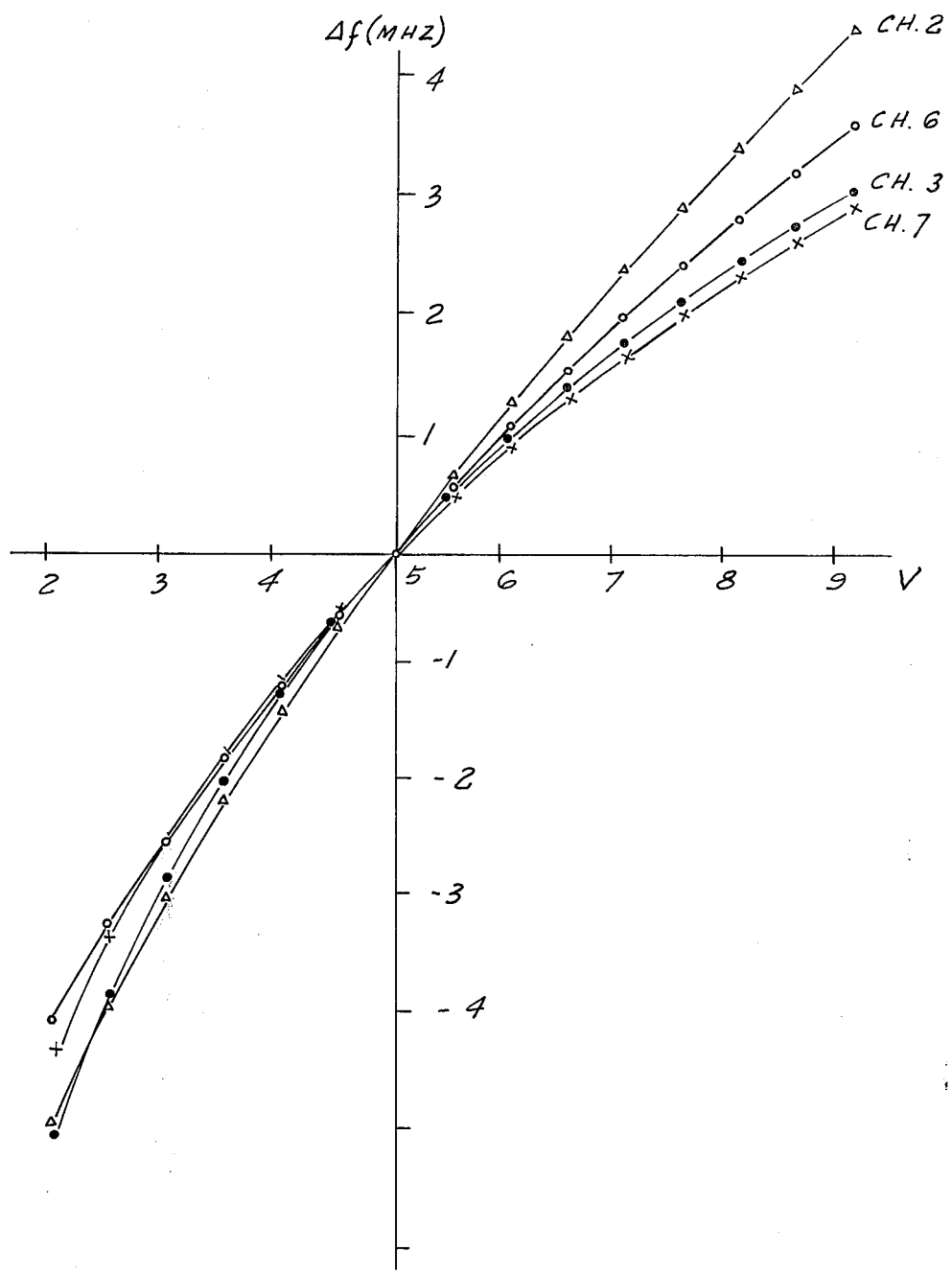

To the accomplishment of the above, and to such other objects as may hereinafter appear, the present invention relates to the construction of an AFC tuning circuit, as defined in the appended claims and as described in this specification, taken together with the accompanying drawings, in which:

FIG. 1 is a prior art AFC tuning circuit;
FIG. 2 is a modification of FIG. 1;
FIG. 3 is another prior art AFC tuning circuit;
FIG. 4 is a modification of FIG. 3;
FIG. 5 is a circuit shown to facilitate explanation of the invention;
FIG. 6 is one embodiment of the invention;
FIG. 7 is another embodiment of the invention; and
FIG. 8 is a graph showing the sensitivity characteristic curve of the invention.

The two types of prior art circuits mentioned above are shown in FIGS. 1–4. FIG. 1 shows the type which provides a poor sensitivity ratio. An inductance coil 2 is connected in parallel with a variable tuning capacitor 4. Varactor 6 has its anode connected to ground and its cathode to a sensitivity adjusting capacitor 8. The other end of capacitor 8 is connected to the junction of coil 2 and capacitor 4. Capacitor 10 represents the remaining overall capacitance of the circuit (including stray capacitance) and is shown as connected between ground and the junction of capacitor 4, capacitor 8, and coil 2. The junction of varactor 6 and capacitor 8 is connected through a resistor 12 to terminal 14. The voltage from the frequency-shift detecting circuit (not shown) is connected to terminal 14. For this circuit the tuning frequency f is expressed as:

$$f = \frac{1}{2\pi \sqrt{LC}} \qquad (1)$$

where $$C = \frac{C_6 C_8}{C_6 + C_8} + C_4 + C_{10}. \qquad (2)$$

$C_6$ is the capacitance of the varactor and each of the other capacitances represents the value of the correspondingly numbered capacitor. After differentiation of equation (1) by $C_6$, $$\frac{d_f}{dC_6} = \frac{d_f}{dC} \cdot \frac{dC}{dC_6} = \frac{-f}{2C} \left(\frac{C_8}{C_6+C_8}\right)^2.$$

Therefore, the sensitivity of the tuning circuit at a particular tuning frequency can be expressed as:

$$\Delta f = \frac{-f}{2C} \left(\frac{C_8}{C_6+C_8}\right)^2 \Delta C_6. \quad (3)$$

The ratio of sensitivities for two different tuning frequencies $f_a$ and $f_b$ can be expressed as:

$$\frac{\Delta f_a}{\Delta f_b} = \frac{\frac{-f_1}{2C_a}\left(\frac{C_8}{C_6+C_8}\right)^2}{\frac{-f_2}{2C_b}\left(\frac{C_8}{C_6+C_8}\right)^2} = \frac{f_a}{f_b} \cdot \frac{C_b}{C_a}. \quad (4)$$

$C_a$ and $C_b$ are the total capacitances C of the tuning circuit at frequencies $f_a$ and $f_b$, respectively. In a tuner utilizing capacitor tuning, $$\frac{f_a}{f_b} = \frac{\frac{1}{2\pi\sqrt{LC_a}}}{\frac{1}{2\pi\sqrt{LC_b}}} = \sqrt{\frac{C_b}{C_a}}. \quad (5)$$

By substituting equation (5) into equation (4), the ratio of sensitivities at frequency $f_a$ and $f_b$ can be expressed as:

$$\frac{\Delta f_a}{\Delta f_b} = \frac{(f_a)^3}{(f_b)^3}. \quad (6)$$

From equation (6), it is clear that the ratio of sensitivities at two frequencies varies in proportion to the cube of the ratio of frequencies. This relationship is directly responsible for the serious difficulties involved in designing an effective and satisfactory AFC circuit for a commonly used frequency band including, for example, channels 2 and 13, as discussed above.

The circuit of FIG. 2 is a modification of FIG. 1. Identical numbers are used to indicate the same components. The only change involves inductance coil 2 which is divided into two parts $2_a$ and $2_b$, with the latter having a switch 16 in parallel with it. In operation, the frequency range is divided into two bands. Both of inductances $2_a$ and $2_b$ are connected in the circuit for the lower frequency band whereas switch 16 is closed to short out inductor $2_b$, leaving only inductor $2_a$ in the circuit, for the higher frequency band. The sensitivity of this circuit is represented by $$\frac{\Delta f_a}{\Delta f_b} = \frac{f_a}{f_b} \cdot \frac{C_b'}{C_a'}. \quad (7)$$

where $C'_a$ and $C'_b$ represent the tuning circuit capacitances which function in cooperation with inductances $2_a + 2_b$ for one band and $2_a$ for the other band.

Since the inductance coil 2 (i.e. coils $2_a + 2_b$) is used to partially tune the circuit, capacitor 4 need not perform the entire tuning function by itself. Consequently, a narrower range of capacitance values can be used in FIG. 2 to obtain the same frequency range, available with the circuit of FIG. 2. Since, therefore, $$\frac{C_b'}{C_a'} < \frac{C_b}{C_a}.$$

the sensitivity ratio of the FIG. 2 circuit, as per equation (7), will be an improvement over the sensitivity ratio of the FIG. 1 circuit, as per equation (4), but it remains unsatisfactory nevertheless. The sensitivity ratio values obtainable with these circuits are shown in Table 1.

TABLE I

| | AFC Sensitivity Ratio | $\Delta f_{ch13}/\Delta f_{ch2}$ |
|---|---|---|
| Circuit of FIG. 1 | $\left(\frac{f_a}{f_b}\right)^3$ | 16.5 |
| Circuit of FIG. 2 | $\frac{f_a}{f_b} \cdot \frac{C_b}{C_a}$ | 4.2 |

To provide an improved sensitivity ratio, the circuit of FIG. 3 has varactor 6 connected in a series circuit with the tuning capacitor 4; the sensitivity adjusting capacitor 8 being eliminated. Both tuning coil 2 and the remaining overall capacitance 10 are in parallel with this series circuit. The total capacitance C and the circuit sensitivity f are expressed as:

$$C = \frac{C_4 C_6}{C_4 + C_6} + C_{10} \quad (8)$$

$$\Delta f = \frac{-f}{2C}\left(\frac{C_4}{C_4+C_6}\right)^2 \Delta C_6. \quad (9)$$

A comparison of equations (2) and (8) reveals that $C_{10}$ has a greater effect in the latter when the values of the various capacitances are the same. Consequently, the circuit of FIG. 3 is significantly more sensitive to any stray capacitance than is the circuit of FIG. 1. If $C_{10}$ is zero, the sensitivity ratio is:

$$\frac{\Delta f_a}{\Delta f_b} = \left(\frac{f_a}{f_b}\right)^3 \left[\frac{C_{4a}(C_6+C_{4b})}{C_{4b}(C_6+C_{4a})}\right]^2 \quad (10)$$

where $C_{4a}$ and $C_{4b}$ are the capacitances $C_4$ of tuning capacitor 4 at frequencies $f_a$ and $f_b$, respectively.

The circuit of FIG. 4 is a modification of the circuit in FIG. 3 with the only change being the division of coil 2 into coils $2_a$ and $2_b$. Coil 2 has a switch 16 in parallel with it. As discussed above with respect to the operation of FIG. 2, this circuit also utilizes both coils $2_a$ and $2_b$ for a lower frequency band while only coil $2_b$, with coil $2_a$ being shorted by switch 16, is utilized for the higher frequency band. Since by changing the inductances a narrower range of tuning capacitances is required, the sensitivity ratio expressed by equation (10) is improved, as discussed above with respect to the circuit of FIG. 2.

The sensitivity ratios for the circuits of FIGS. 3 and 4 are shown in Table 2.

TABLE 2

| | AFC Sensitivity Ratio | $\Delta f_{ch2}/\Delta f_{ch13}$ |
|---|---|---|
| Circuit of FIG. 3 | $\left(\dfrac{f_a}{f_b}\right)^3 \left[\dfrac{C_{4a}(C_6+C_{4b})}{C_{4b}(C_6+C_{4a})}\right]^2$ | 2.5 or more |
| Circuit of FIG. 4 | same | 1.25 or more |

A comparison of Tables 1 and 2 reveals that the second type of AFC circuit has a better uniformity, with the FIG. 4 embodiment being relatively close to the ideal unity. However, this improved performance is achieved only if $C_{10}$ is at a relatively insignificant value. Thus, great care is required to minimize the stray inductance. Otherwise, equation (10) would not apply and the sensitivity ratio would deteriorate to approximately 2. Also, the circuit is susceptible to stray inductance of the varactor 6 which can cause oscillation and discontinuities in the sensitivity characteristic curve. Furthermore, the circuit, still using the television channel example, must satisfy the condition $$\frac{f_{ch6}}{f_{ch13}} = \frac{C_{4(ch13)}}{C_{4(ch6)}} \text{ where } C_{4(ch6)} \text{ and } C_{4(ch13)}$$

are the capacitance values of tuning capacitor 4 at the frequencies used for channels 6 and 13, respectively. Therefore, circuit adjustments required during the production process may be difficult.

The present invention is aimed at providing a good sensitivity ratio in a circuit that needs little adjustment during its manufacture. The circuit of FIG. 5 is shown to facilitate the explanation of the present invention. A varactor 6 is connected in series between ground and an inductance coil 2. Tuning capacitor 4 is connected in parallel with this series circuit. Capacitor 10 connected in parallel with the tuning capacitance represents the remaining overall capacitance of the circuit. Another capacitor 17 is connected in parallel with the varactor 6. The junction of the varactor 6 and coil 2 is connected by way of resistor 12 to terminal 14. The frequency-shift detecting circuit (not shown) is connected to terminal 14. The total capacitance C and the circuit sensitivity f of this circuit are:

$$C = \frac{(C_{17}+C_6)(C_4+C_{10})}{C_4+C_6+C_{10}+C_{17}} \quad (11)$$

$$\Delta f = \frac{-f}{2C}\left(\frac{C_4+C_{10}}{C_4+C_6+C_{10}+C_{17}}\right) \quad (12)$$

Where $C_4$ is the tuning capacitance, $C_6$ is the capacitance of the varactor 6, $C_{10}$ is the remaining overall circuit capacitance, and C is the capacitance of capacitor 17.

The sensitivity ratio obtained from equation (12) for frequencies $f_a$ and $f_b$ is:

$$\frac{\Delta f_a}{\Delta f_b} = \frac{\dfrac{-f_a}{2C_a}\left(\dfrac{C_{4a}+C_{10}}{C_{4a}+C_6+C_{10}+C_{17}}\right)^2 \Delta C_6}{\dfrac{-f_b}{2C_b}\left(\dfrac{C_{4b}+C_{10}}{C_{4b}+C_6+C_{10}+C_{17}}\right)^2 \Delta C_6} \quad (13)$$

where $C_a$ and $C_b$ are the total capacitances of the tuning circuit at frequencies $f_a$ and $f_b$, respectively, and where $C_{4a}$ and $C_{4b}$ are the capacitance values of the tuning capacitor 4 at frequencies $f_a$ and $f_b$, respectively.

Since in capacitor tuning $$\frac{f_a}{f_b} = \frac{\dfrac{1}{2\pi\sqrt{LC_a}}}{\dfrac{1}{2\pi\sqrt{LC_b}}} = \sqrt{\frac{C_b}{C_a}}, \quad (14)$$

the sensitivity ratio, obtained by substituting equation (14) into equation (13), is:

$$\frac{\Delta f_a}{\Delta f_b} = \frac{f_b}{f_a} \quad (15)$$

Thus, the circuit of the present invention has a sensitivity ratio inversely proportional to the ratio of corresponding frequencies, as shown in equation (15). In contrast, the conventional circuits discussed above involved sensitivity ratios proportional to the cube of the corresponding frequency ratio, as shown by equations (6) and (10). This combined with the fact that the sensitivity at a high frequency is less than that at a low frequency provides the circuit with a stable characteristic which is free from oscillation and discontinuities in its sensitivity characteristic curve. Furthermore, the stray capacitance $C_{10}$ is relatively insignificant, as seen from equation (11). Thus, the present circuit is for all practical purposes, independent of $C_{10}$ and requires less component adjustment during production. The resultant value of the sensitivity ratio with this circuit over the range of frequency from channel 2 to 13 is:

$$\frac{\Delta f_{ch13}}{\Delta f_{ch2}} = 2.5$$

The circuit lends itself to adjustment of the ratio closer to the optimum because capacitor 17 is a factor involved in the determination of circuit sensitivity, as should be apparent from equation (12). It is, therefore, possible to improve this ratio while retaining the above-mentioned advantageous features. This can be done by separating the frequency range from channel 2 to channel 13 into two frequency bands. By inserting capacitor 17 into the circuit for a particular frequency band, the sensitivity ratio of one frequency band can be made approximately equal to the sensitivity ratio in the other band. This is the general idea behind the circuit of FIG. 6 which shows the tuning coil 2 of FIG. 5 as divided into coils $2_a$ and $2_b$ and both being connected in series with varactor 6. Tuning capacitor 4 and stray capacitance 10 are both in parallel with the series circuit. A switch 16 is in parallel with coil $2_b$. Sensitivity adjusting capacitor 17 is connectable in parallel with varactor 6 through a switch 18.

Continuing with the usage of channels 2–13 for the frequency range involved, two bands of frequency are selected with one being between channels 2 and 6 and the other being between channels 6 and 13. With the circuit of FIG. 5 each band will have a somewhat different sensitivity ratio. However, by selecting an appropriate value for the sensitivity adjusting capacitor 17 the better of the two sensitivity ratios (i.e. the one nearer the ideal 1) is chosen as the sensitivity of the entire frequency range with the other band being adjusted to this sensitivity by switching capacitor 17 into the circuit with the closing of switch 18. In the television channel example, such value may be 20–100 pf. In addition, the sensitivity ratios of the two bands can be matched irrespective of the condition $$\frac{C_{4(ch13)}}{C_{4(ch6)}} = \frac{f_{ch6}}{f_{ch13}}.$$

discussed above, because insertion of the sensitivity adjusting capacitor 12 obviates the need for this condition to further simplify component selection during production.

Inductance coils $2_a$ and $2_b$ are used to further improve operation of the circuit by requiring less of a variation in the tuning capacitance of capacitor 4 to enable detection of channels 2 through 13, as discussed in detail above and as applicable to this circuit by virtue of equation (13).

In operation, switches 16 and 18 are in the open position for the lower frequency band. Consequently, inductor coils $2_a$ and $2_b$ are in the circuit while capacitor 17 is not. At the transition point between the two bands, switches 16 and 18 are moved, respectively, to positions 16' and 18'. Now the coil $2_b$ is shorted and capacitor 17 is inserted into the circuit for the upper frequency band. A sensitivity ratio of 1.125 has been obtained with this circuit.

FIG. 7 shows a further embodiment of the present invention. Components similar to those used in FIG. 6 are identically numbered. A varactor 6 has its anode connected to ground and its cathode to tuning coil $2_b$ which, in turn, is connected to tuning coil $2_a$. Another varactor 20 is connected in series with a capacitor 22. Capacitor 10 representing the remaining overall capacitance of the circuit is shown as connected in parallel with the series circuit. The junction of capacitors 10 and 22 is connected to the free end of coil $2_a$. The junction of varactor 20 and capacitor 22 is connected to a variable voltage source which causes the varactor to change its capacitance in order to tune the circuit to a particular transmitted frequency. Thus, varactor 20 and capacitor 22 are together equivalent to tuning capacitor 4 in FIG. 5. The AFC frequency-drift detector voltage is connected to terminal 14, as is conventional. A switching diode 24 is connected in parallel with coil $2_b$ through DC blocking capacitors 26 and 28. The cathode of diode 24 is connected to capacitor 28 whereas its anode is connected to capacitor 26. The sensitivity adjusting capacitor 17 is connected across varactor 6 by means of a switching diode 30 and DC blocking capacitor 28. The cathode of diode 30 is connected to the junction of capacitor 28 and diode 24 and its anode is connected to capacitor 17. The cathodes of both switching diodes 24 and 20 are connected to ground through a choke coil 32 whereas their respective anodes are connected by means of resistors 34 and 36 to a terminal 38. An on-off voltage is applied at terminal 38.

Operation of the AFC tuning circuit shown in FIG. 7 is as follows:

When "off" voltage is applied to terminal 38, switching diodes 24 and 30 (which correspond to switches 16 and 18 in FIG. 6) have a high impedance in cooperation with choking coil 32. Therefore, coils $2_a$ and $2_b$ are operably connected in the tuning circuit. This arrangement is utilized for the lower frequency band. For the higher frequency band an "on" voltage is applied at terminal 38 and switching diodes 24 and 30 consequently have a very low impedance. In this condition, coil $2_b$ is shorted out of the circuit and capacitor 17 is placed in parallel with varactor 6. Thus, the circuit of FIG. 7 is equivalent in operation to that of FIG. 6.

FIG. 8 is a graph showing the circuit sensitivity for various voltages obtained from the frequency shift detector circuit. In the graph, voltage from the frequency-drift detector is plotted on the abscissa and the frequency shift is plotted on the ordinate. The AFC sensitivity characteristic for channels 2, 6, 7 and 13 is shown by way of example. Within the range of the graph, the sensitivity is less than 1.5 for $\Delta f > 0$, and is less than 1.125 for $\Delta f < 0$.

It will be apparent from the foregoing that the advantages of the present invention are achieved by connecting an AFC varactor in series with the inductance coil and by having a sensitivity adjusting capacitor selectively connectable across the varactor for different frequency bands.

While but two embodiments of the present invention have been here specifically disclosed, it will be apparent that many variations may be made therein, all within the scope of the instant invention as defined in the following claims.

I claim:

1. An AFC tuning circuit of the type having detection means for generating a voltage signal dependent upon the frequency drift of the circuit, said tuning circuit comprising a voltage controlled capacitor operably connected to said detection means and responsive to said voltage signal to vary the capacitance thereof, an AFC sensitivity determining capacitor conditionally connected in parallel to said voltage controlled capacitor, said voltage signal from said detection means being applied at the junction between said AFC sensitivity determining capacitor and said voltage controlled capacitor, means for disconnecting said AFC sensitivity determining capacitor from said voltage controlled capacitor, an inductor operatively connected in series with said parallel circuit and a variable tuning capacitor operably connected in parallel with said series circuit.

2. The AFC tuning circuit of claim 1 wherein said inductance comprises first and second inductance coils and further comprising means for short circuiting one of said coils.

3. The AFC tuning circuit of claim 2 wherein said disconnecting means and said short circuiting means are jointly actuatable.

\* \* \* \* \*